United States Patent
Iwasaki et al.

(10) Patent No.: US 10,510,680 B2
(45) Date of Patent: Dec. 17, 2019

(54) SEMICONDUCTOR DEVICE HAVING ELECTROMAGNETIC WAVE ATTENUATION LAYER

(71) Applicant: KABUSHIKI KAISHA TOSHIBA, Tokyo (JP)

(72) Inventors: Hitoshi Iwasaki, Tokyo (JP); Akira Kikitsu, Kanagawa (JP); Yoshinari Kurosaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/908,590

(22) Filed: Feb. 28, 2018

(65) Prior Publication Data
US 2019/0081007 A1    Mar. 14, 2019

(30) Foreign Application Priority Data
Sep. 13, 2017  (JP) .................................. 2017-176069

(51) Int. Cl.
*H01L 23/552* (2006.01)
*H01L 43/02* (2006.01)
(Continued)

(52) U.S. Cl.
CPC .......... *H01L 23/552* (2013.01); *G11B 5/3932* (2013.01); *H01L 23/3121* (2013.01); *H01L 43/02* (2013.01); *H01L 43/08* (2013.01); *H01L 23/3128* (2013.01); *H01L 24/48* (2013.01); *H01L 2224/48091* (2013.01);
(Continued)

(58) Field of Classification Search
CPC ... H01L 23/552–556; H01L 2924/3025; H01L 43/02–08; G02F 2001/133334; G11B 5/39–3993
See application file for complete search history.

(56) References Cited

U.S. PATENT DOCUMENTS

| | | | | |
|---|---|---|---|---|
| 5,154,983 | A | * | 10/1992 | Watanabe ............. C22C 38/001 148/306 |
| 5,236,791 | A | * | 8/1993 | Yahisa ..................... G11B 5/72 428/611 |

(Continued)

FOREIGN PATENT DOCUMENTS

| | | |
|---|---|---|
| JP | S63-199219 | 8/1988 |
| JP | 2550996 | 8/1996 |

(Continued)

*Primary Examiner* — Nelson Garces
(74) *Attorney, Agent, or Firm* — Finnegan, Henderson, Farabow, Garrett & Dunner, L.L.P.

(57) ABSTRACT

A semiconductor device including a semiconductor element and a first member is provided. The first member includes a first magnetic planar region separated from the semiconductor element in a first direction, and a first nonmagnetic planar region provided between the first magnetic planar region and the semiconductor element in the first direction. At least a portion of the first magnetic planar region includes $Fe_{100-x1-x2}\alpha_{x1}N_{x2}$, where $\alpha$ includes at least one selected from the group consisting of Zr, Hf, Ta, Nb, Ti, Si, and Al, $x1$ is not less than 0.5 atomic percent and not more than 10 atomic percent, and $x2$ is not less than 0.5 atomic percent and not more than 8 atomic percent.

18 Claims, 11 Drawing Sheets

(51) Int. Cl.
  *H01L 43/08* (2006.01)
  *H01L 23/31* (2006.01)
  *G11B 5/39* (2006.01)
  *H01L 23/00* (2006.01)

(52) U.S. Cl.
  CPC ............. *H01L 2224/48106* (2013.01); *H01L 2224/48227* (2013.01); *H01L 2924/15311* (2013.01); *H01L 2924/3025* (2013.01)

(56) References Cited

U.S. PATENT DOCUMENTS

| | | | |
|---|---|---|---|
| 7,872,471 | B2 | 1/2011 | Yamanaka et al. |
| 2014/0374860 | A1* | 12/2014 | Suzuki ................. H01L 23/552 257/422 |
| 2016/0093796 | A1* | 3/2016 | Arai ....................... H01L 43/02 257/422 |
| 2017/0050842 | A1 | 2/2017 | Yamada et al. |
| 2018/0269181 | A1* | 9/2018 | Yang ................... H01L 25/0655 |
| 2018/0301420 | A1* | 10/2018 | Kim ..................... H01L 23/552 |
| 2018/0337139 | A1 | 11/2018 | Kikitsu et al. |

FOREIGN PATENT DOCUMENTS

| | | |
|---|---|---|
| JP | 2008-52818 | 3/2008 |
| JP | 2010-6182 | 1/2010 |
| JP | 2012-33764 | 2/2012 |
| JP | 2012-38807 | 2/2012 |
| JP | 2017-41617 | 2/2017 |
| JP | 2018-195660 A | 12/2018 |

* cited by examiner

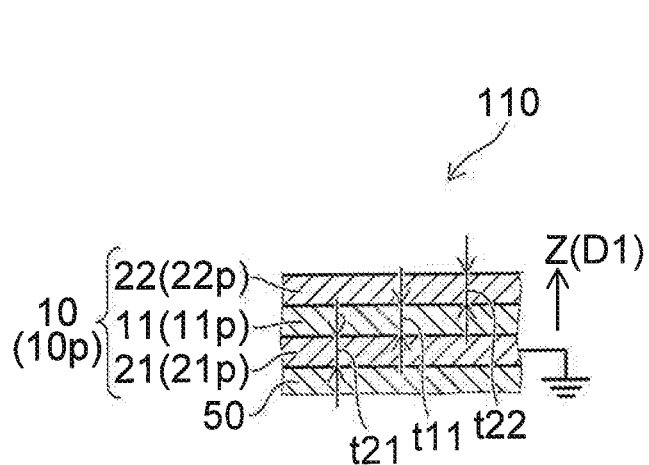
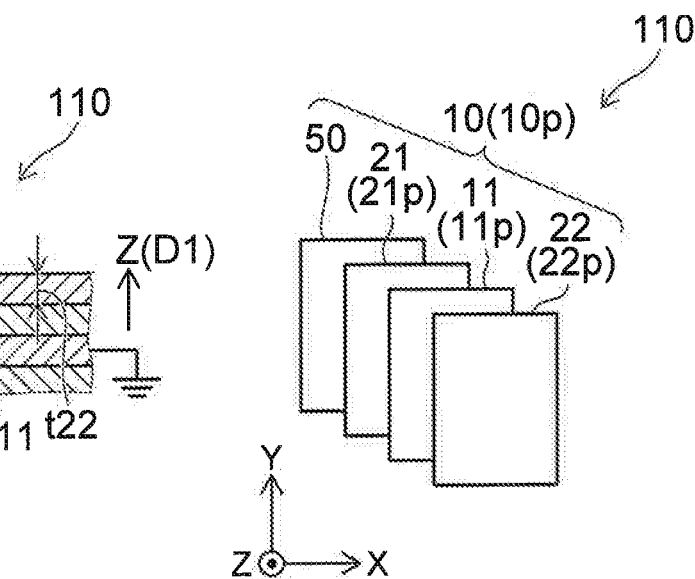
FIG. 2A  FIG. 2B
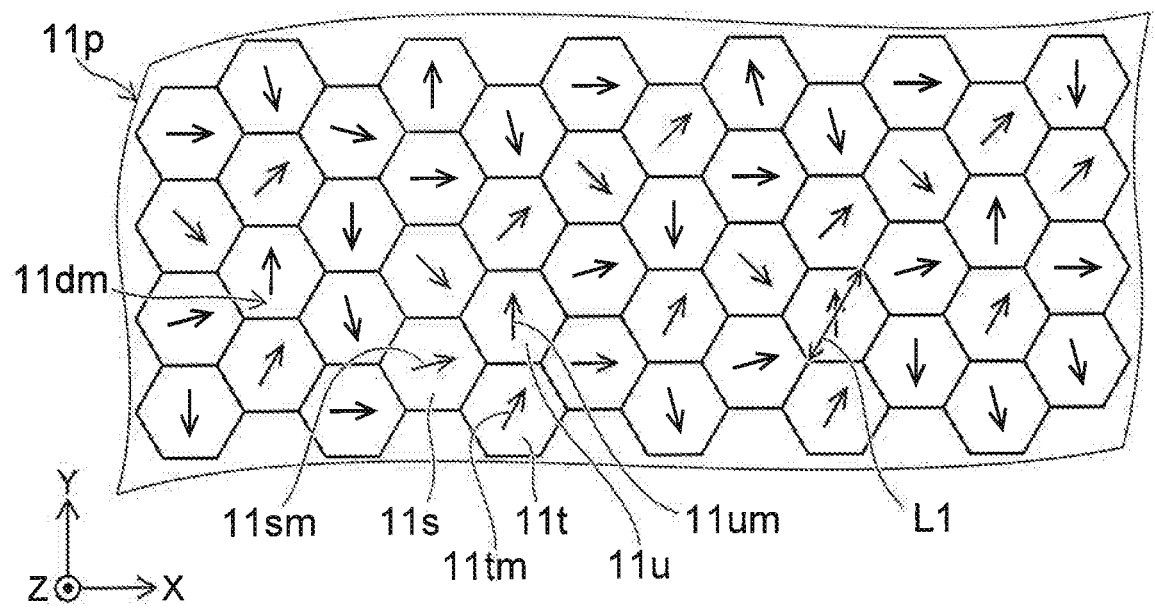
FIG. 3

|  |  | Hc(Oe) | μr |
|---|---|---|---|
| SP11 | FeSi | 15 | 100 |
| SP12 | FeSi(Ts=200°C) | 5 | 200 |
| SP13 | FeSi(Ts=350°C) | 2.5 | 350 |
| SP14 | FeAlSi(Ta=600°C) | 0.1 | 10000 |
| SP21 | $Fe_{93}Zr_4N_3$ | 0.6 | 1800 |
| SP22 | $Fe_{96.5}Zr_2N_{1.5}$ | 0.5 | 1300 |
| SP23 | $Fe_{97.5}Zr_2N_{0.5}$ | 0.8 | 750 |
| SP24 | $Fe_{90}Zr_8N_2$ | 1.2 | 800 |

| | x1(at%) | x2(at%) | Hc(Oe) |
|---|---|---|---|
| SP31 | 12.5 | 3 | 13 |
| SP32 | 10 | 2 | 4 |
| SP33 | 5.5 | 8 | 2 |
| SP34 | 5 | 1.5 | 0.7 |
| SP35 | 4.5 | 3 | 1.5 |
| SP36 | 4.5 | 6 | 1.2 |
| SP37 | 2 | 1.5 | 0.5 |
| SP38 | 1 | 0.5 | 3.5 |
| SP39 | 0.5 | 0.5 | 4.5 |

|  | α | x1(at%) | x2(at%) | Hc(Oe) |
|---|---|---|---|---|
| SP41 | Ta | 3 | 1 | 0.8 |
| SP42 | Ta | 5 | 3 | 2.5 |
| SP43 | Nb | 5 | 1 | 3.2 |
| SP44 | Hf | 2 | 1 | 1.3 |
| SP45 | Hf | 5 | 1 | 0.7 |
| SP46 | Hf | 10 | 3 | 4.5 |
| SP47 | Ti | 5 | 2 | 2.5 |
| SP48 | Ti | 2 | 2 | 0.9 |

FIG. 12

|  |  | Hc(Oe) |
|---|---|---|
| SP51 | Fe | 20 |
| SP52 | $Fe_{92}Zr_8$ | 11 |
| SP53 | $Fe_{98}Zr_2$ | 8 |
| SP54 | $Fe_{96}Ta_4$ | 10 |
| SP55 | $FeSi_4$ | 15 |

FIG. 13

|  | t21(nm) | t11(nm) | t22(nm) | t21+t22(nm) |
|---|---|---|---|---|
| SP61 | 480 | 40 | 480 | 960 |
| SP62 | 450 | 100 | 450 | 900 |
| SP63 | 400 | 200 | 400 | 800 |
| SP64 | 300 | 400 | 300 | 600 |
| SP65 | 200 | 600 | 200 | 400 |
| SP66 | 100 | 800 | 100 | 200 |
| SP67 | 50 | 900 | 50 | 100 |

FIG. 14

SEMICONDUCTOR DEVICE HAVING ELECTROMAGNETIC WAVE ATTENUATION LAYER

CROSS-REFERENCE TO RELATED APPLICATIONS

This application is based upon and claims the benefit of priority from Japanese Patent Application No. 2017-176069, filed on Sep. 13, 2017; the entire contents of which are incorporated herein by reference.

FIELD

Embodiments described herein relate generally to a semiconductor device.

BACKGROUND

For example, there is a semiconductor device that includes a semiconductor element and a shield layer. Electromagnetic waves that are radiated from the semiconductor element are shielded by the shield layer. It is desirable to improve the attenuation characteristics of the electromagnetic waves.

BRIEF DESCRIPTION OF THE DRAWINGS

FIG. 2A and FIG. 2B are schematic views illustrating the semiconductor device according to the first embodiment;

FIG. 3 is a schematic view illustrating a portion of the semiconductor device according to the first embodiment;

FIG. 12 is a table illustrating characteristics of the magnetic films;

FIG. 13 is a table illustrating a characteristic of the magnetic films;

FIG. 14 is a table illustrating configurations of the shield films;

DETAILED DESCRIPTION

Figure 1A:
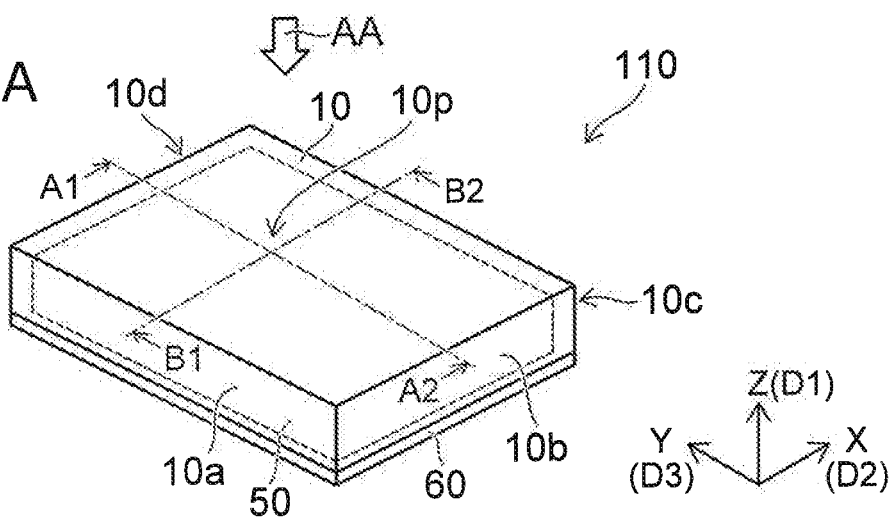
FIG. 1A to FIG. 1D are schematic views illustrating a semiconductor device according to a first embodiment.

According to one embodiment, a semiconductor device includes a semiconductor element, and a first member. The first member includes a first magnetic planar region separated from the semiconductor element in a first direction, and a first nonmagnetic planar region provided between the first magnetic planar region and the semiconductor element in the first direction. At least a portion of the first magnetic planar region includes $Fe_{100-x1-x2}\alpha_{x1}N_{x2}$. $\alpha$ includes at least one selected from the group consisting of Zr, Hf, Ta, Nb, Ti, Si, and Al. x1 is not less than 0.5 atomic percent and not more than 10 atomic percent. x2 is not less than 0.5 atomic percent and not more than 8 atomic percent.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
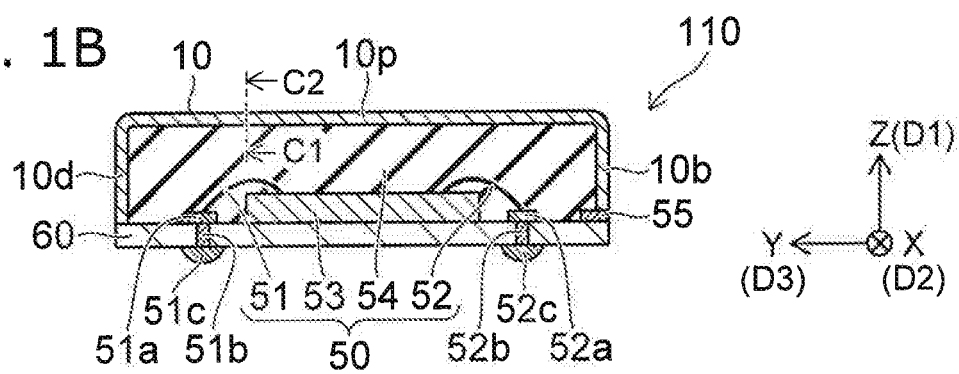
Figure 1C:
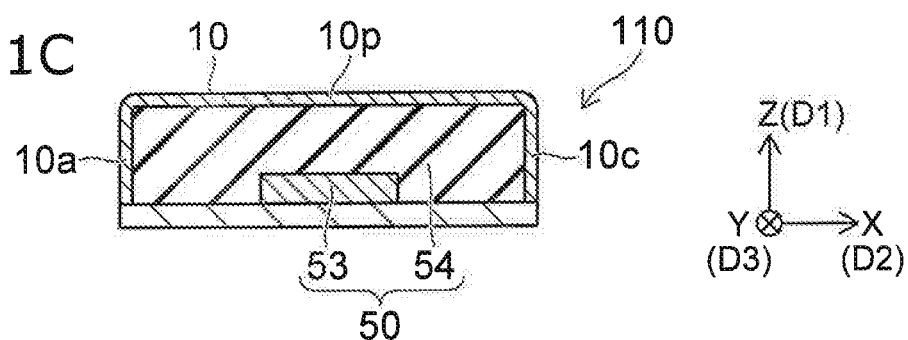
Figure 1D:
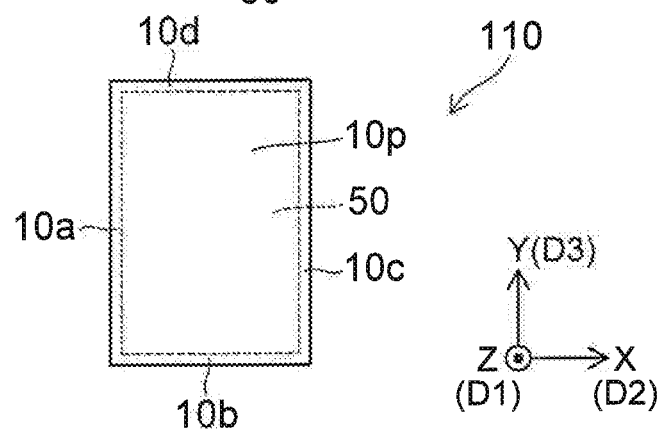

FIG. 1A to FIG. 1D are schematic views illustrating a semiconductor device according to a first embodiment. FIG. 1A is a perspective view. FIG. 1B is a line A1-A2 cross-sectional view of FIG. 1A. FIG. 1C is a line B1-B2 cross-sectional view of FIG. 1A. FIG. 1D is a plan view as viewed along arrow AA of FIG. 1A.

As shown in FIG. 1A, the semiconductor device 110 according to the first embodiment includes a semiconductor element 50 and a first member 10. A base body 60 is further provided in the example. The first member 10 covers at least a portion of the semiconductor element 50.

In the example as shown in FIG. 1B, the semiconductor element 50 includes a semiconductor chip 53, an insulating portion 54, a first wire 51, and a second wire 52. In the example, a first electrode 51*a*, a second electrode 52*a*, a first connector 51*b*, a second connector 52*b*, a first terminal 51*c*, and a second terminal 52*c* are provided at the base body 60. The first wire 51 electrically connects the first electrode 51*a* and a portion of the semiconductor chip 53. The second wire 52 electrically connects the second electrode 52*a* and another portion of the semiconductor chip 53. The first electrode 51*a* and the first terminal 51*c* are electrically connected by the first connector 51*b*. The second electrode 52*a* and the second terminal 52*c* are electrically connected by the second connector 52*b*. These connectors pierce the base body 60. These terminals function as input/output portions of the semiconductor chip 53. The insulating portion 54 is provided around the semiconductor chip 53. The insulating portion 54 includes, for example, at least one of a resin, a ceramic, etc. The semiconductor chip 53 is protected by the insulating portion 54. The semiconductor element 50 includes, for example, at least one of an arithmetic circuit, a control circuit, a storage circuit, a switching circuit, a signal processing circuit, or a high frequency circuit. Multiple semiconductor elements 50 may be provided in the embodiment.

As illustrated in FIG. 1B, the first member 10 is electrically connected to a terminal 55 provided at the base body 60. The first member 10 is set to a constant potential (e.g., a ground potential) via the terminal 55. For example, the first member 10 shields (attenuates) the electromagnetic waves radiated from the semiconductor element 50. The first member 10 functions as, for example, a shield.

As shown in FIG. 1A to FIG. 1C, the first member 10 includes a planar portion 10p and first to fourth side surface portions 10a to 10d. The planar portion 10p of the first member 10 is separated from the semiconductor element 50 along a first direction D1.

The first direction D1 is taken as a Z-axis direction. One direction perpendicular to the Z-axis direction is taken as a Y-axis direction. A direction perpendicular to the Z-axis direction and the Y-axis direction is taken as an X-axis direction.

As shown in FIG. 1B and FIG. 1C, the semiconductor element 50 is positioned between the planar portion 10p and the base body 60 in the first direction D1.

As shown in FIG. 1C and FIG. 1D, the semiconductor element 50 is positioned between the first side surface portion 10a and the third side surface portion 10c in a second direction D2. The second direction D2 crosses the first direction D1. In the example, the second direction D2 is the X-axis direction.

As shown in FIG. 1B and FIG. 1D, the semiconductor element 50 is positioned between the second side surface portion 10b and the fourth side surface portion 10d in a third direction D3. The third direction D3 crosses a plane (e.g., the Z-X plane) including the first direction D1 and the second direction D2. In the example, the third direction D3 is the Y-axis direction.

As described below, the first member 10 includes multiple films. An example of the multiple films will now be described.

FIG. 2A and FIG. 2B are schematic views illustrating the semiconductor device according to the first embodiment.

FIG. 2A is a line C1-C2 cross-sectional view of FIG. 1B. FIG. 2B schematically shows the configuration of the films, etc., included in the first member 10. In FIG. 2B, the positions of the multiple films are drawn as being shifted for easier viewing of the drawing.

As shown in FIG. 2A and FIG. 2B, the first member 10 includes a first nonmagnetic film 21, a first magnetic film 11, and a second nonmagnetic film 22.

The first nonmagnetic film 21 includes a first nonmagnetic planar region 21p. The first magnetic film 11 includes a first magnetic planar region 11p. The second nonmagnetic film 22 includes a second nonmagnetic planar region 22p.

The first magnetic planar region 11p is separated from the semiconductor element 50 in the first direction D1 (the Z-axis direction). The first nonmagnetic planar region 21p is provided between the first magnetic planar region 11p and the semiconductor element 50 in the first direction D1.

The first magnetic planar region 11p is positioned between the first nonmagnetic planar region 21p and the second nonmagnetic planar region 22p in the first direction D1.

A thickness t21 along the first direction D1 of the first nonmagnetic planar region 21p is, for example, 150 nm or more. A thickness t22 along the first direction D1 of the second nonmagnetic planar region 22p is, for example, 150 nm or more. A thickness t11 along the first direction D1 of the first magnetic planar region 11p is 50 nm or more.

For example, the first magnetic planar region 11p contacts the first nonmagnetic planar region 21p and the second nonmagnetic planar region 22p.

Thus, a nonmagnetic film (region) and a magnetic film (region) are provided in the embodiment. When an electromagnetic wave is incident on the first member 10, the electromagnetic wave undergoes multiple reflections at the interface between the nonmagnetic film and the magnetic film. A portion of the electromagnetic wave may be absorbed at the interface. Thereby, the electromagnetic wave that passes through the first member 10 is attenuated. The first member 10 functions as a shield.

In the embodiment, the number of interfaces between the nonmagnetic film (region) and the magnetic film (region) may be one. The number of interfaces between the nonmagnetic films (regions) and the magnetic films (regions) may be two or more. In the case where the first magnetic planar region 11p, the first nonmagnetic planar region 21p, and the second nonmagnetic planar region 22p are provided, the number of interfaces is two. In the case where the number of interfaces is high, the electromagnetic waves are attenuated more effectively. As described below, the number of interfaces may be three or more.

The planar portion 10p of the first member 10 is illustrated in FIG. 2A and FIG. 2B. The nonmagnetic film (region) and the magnetic film (region) are provided in the planar portion 10p. As described below, the nonmagnetic film (region) and the magnetic film (region) may be provided similarly in the side surface portions (the first to fourth side surface portions 10a to 10d) as well. The planar portion 10p will now be described further. The description recited below is applied also to the side surface portions.

At least one of the first nonmagnetic planar region 21p or the second nonmagnetic planar region 22p includes, for example, at least one selected from the group consisting of Cu, Al, and Ag. At least one of the first nonmagnetic planar region 21p or the second nonmagnetic planar region 22p includes, for example, Cu. By the nonmagnetic film (region) including such a material, for example, the resistance of the nonmagnetic film can be set to be low. For example, the electromagnetic waves can be attenuated more effectively.

In the embodiment, at least a portion of the first magnetic planar region 11p includes $Fe_{100-x1-x2}\alpha_{x1}N_{x2}$. "α" recited above includes at least one selected from the group consisting of Zr, Hf, Ta, Nb, Ti, Si, and Al. x1 recited above is not less than 0.5 atomic percent (at %) and not more than 10 atomic percent. x2 recited above is not less than 0.5 atomic percent and not more than 8 atomic percent.

By the first magnetic planar region 11p including such a material, the attenuation characteristics of the electromagnetic waves can be improved. For example, a coercivity Hc is small for such a material. Multiple magnetic domains are formed in the first magnetic planar region 11p. The magnetizations of the multiple magnetic domains are aligned with various directions. Thereby, electromagnetic waves having various vibration directions can be attenuated effectively.

FIG. 3 is a schematic view illustrating a portion of the semiconductor device according to the first embodiment.

FIG. 3 illustrates the first magnetic planar region 11p. The first magnetic planar region 11p includes multiple magnetic domains 11dm. The multiple magnetic domains 11dm are arranged in a plane (e.g., the X-Y plane) crossing the first direction D1.

One of the multiple magnetic domains 11dm is taken as a first magnetic domain 11s. Another one of the multiple magnetic domains 11dm is taken as a second magnetic domain 11t. Yet another one of the multiple magnetic domains 11dm is taken as a third magnetic domain 11u. For example, the direction of a magnetization 11sm of the one (the first magnetic domain 11s) of the multiple magnetic domains 11dm crosses the direction of a magnetization 11tm of the other one (the second magnetic domain 11t) of the multiple magnetic domains 11dm. For example, a direction of a magnetization 11um of the yet another one (the third magnetic domain 11u) of the multiple magnetic domains 11dm crosses the direction of the magnetization 11sm of the first magnetic domain 11s. The magnetization 11um crosses the direction of the magnetization 11tm of the second magnetic domain 11t.

Thus, the directions of the magnetizations of the multiple magnetic domains 11dm are not the same. Thereby, electromagnetic waves having various vibration directions can be attenuated effectively.

For example, multiple wires are provided for the semiconductor chip 53. The multiple wires extend in various directions. Therefore, electromagnetic waves are emitted in various vibration directions from the semiconductor chip 53. Such electromagnetic waves can be attenuated effectively by the first member 10.

A width L1 of one of the multiple magnetic domains 11dm is, for example, not less than 0.1 μm and not more than 200 μm. The width L1 corresponds to the length along a direction crossing the first direction D1. On the other hand, the frequency of the electromagnetic waves generated from the semiconductor chip 53 is about 1 GHz. In such a case, the wavelength of the electromagnetic waves is about 1 cm. The electromagnetic waves having such a frequency can be attenuated effectively in the case where the width L1 is, for example, not less than 0.1 μm and not more than 200 μm.

The components of the vibrations of the electromagnetic waves are attenuated effectively by the directions of the magnetizations of at least two magnetic domains 11dm crossing each other.

For example, there is a first reference example in which a thick Cu layer (having, for example, a thickness of 3 μm) is used as the shield. In such a first reference example, it is difficult to set the semiconductor device to be thin because the shield is thick. In the case where the shield is thick, its deposition time becomes longer; and it is difficult to make many elements in a short period of time.

Conversely, the magnetic film (region) and the nonmagnetic film (region) are provided in the embodiment. Therefore, a high attenuation effect is obtained even in the case where the planar portion 10p is thin. In the embodiment, the thickness of the semiconductor device is reduced easily.

In the embodiment, the first magnetic planar region 11p includes the $Fe_{100-x1-x2}\alpha_{x1}N_{x2}$ recited above. The magnetic properties of this material are thermally stable. For example, there are cases where the semiconductor device is resin-molded. In the resin mold process, for example, the semiconductor device is heated to a temperature of 260° C. By the first magnetic planar region 11p including the $Fe_{100-x1-x2}\alpha_{x1}N_{x2}$ recited above, stable magnetic properties can be maintained even in the case of the heating.

For example, there is a second reference example in which a NiFe material or a Co based amorphous material is used as the magnetic film of the shield. In the second reference example, multiple magnetic films are laminated; and the directions of the magnetizations of the multiple magnetic films are set to be different each other. Thereby, the electromagnetic waves are attenuated in various vibration directions. In the second reference example, for example, the magnetic films are formed in a magnetic field; and the magnetizations of the magnetic films are fixed in the magnetic field directions during the film formation. For example, induced magnetic anisotropy due to cooling in a magnetic field is utilized. In the second reference example, for example, due to the heat treatment of 260° C., the directions of the induced magnetic anisotropy are changed by the influence of an external magnetic field. Therefore, it is difficult to practically and sufficiently obtain the shielding effect.

In the embodiment, it is unnecessary to perform heat treatment at a high temperature for the $Fe_{100-x1-x2}\alpha_{x1}N_{x2}$ of the magnetic film (the first magnetic planar region 11p) of the first member 10. Therefore, good shield performance is obtained while suppressing thermal damage of the semiconductor element 50. Good attenuation characteristics of the electromagnetic waves are obtained.

In the embodiment as described above, the semiconductor element 50 includes the semiconductor chip 53 and the insulating portion 54. For example, the insulating portion 54 is provided between the first member 10 and at least a portion of the semiconductor chip 53. The insulating portion 54 includes, for example, a resin. In the embodiment, thermal damage of the resin can be suppressed particularly because it is unnecessary to perform heat treatment at a high temperature for the $Fe_{100-x1-x2}\alpha_{x1}N_{x2}$. Because it is unnecessary to perform heat treatment at a high temperature, the damage of the semiconductor chip 53 can be suppressed.

The coercivity Hc will now be focused upon as a characteristic of the magnetic film. The evaluation results of the shield characteristics when changing the coercivity Hc will now be described for the configuration of the second reference example recited above while comparing to the first reference example.

Figure 4:
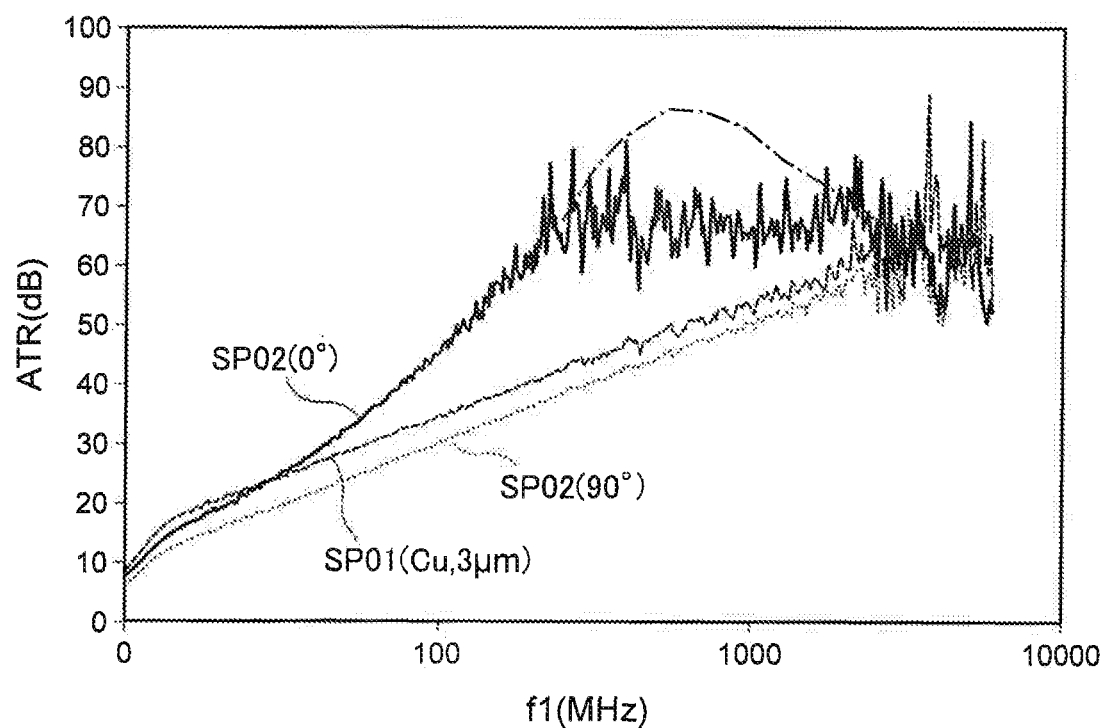
FIG. 4 is a graph illustrating characteristics of the shield films.

FIG. 4 is a graph illustrating characteristics of the shield films.

Measurement results relating to a sample SP01 and a sample SP02 are shown in FIG. 4. In the sample SP01, a Cu film having a thickness of 3 μm is used as the shield film. In the sample SP02, a stacked film of a Cu film (having a thickness of 530 nm)/NiFe film (having a thickness of 200 nm)/Cu film (having a thickness of 530 nm)/CoZrNb film (having a thickness of 200 nm)/Cu film (having a thickness of 530 nm) is provided as the shield film. For the NIFe film and the CoZrNb film, the coercivity Hc is small and is about 1 Oe (oersteds).

The attenuation characteristics of the electromagnetic waves are evaluated for such samples. The horizontal axis of FIG. 4 is a frequency f1 (MHz) of the electromagnetic wave. The vertical axis is an attenuation rate ATR (dB). For the sample SP02, the case where the angle between the direction of the magnetic field applied in the formation of the magnetic film and the vibration direction of the electric field of the electromagnetic wave is 0° (SP02(0°)) and the case of 90° (SP02(90°)) are shown. For the sample SP01 (the Cu film), the Cu film is isotropic and therefore is independent of the vibration direction of the electric field of the electromagnetic wave.

As shown in FIG. 4, the attenuation rate ATR is substantially the same as the attenuation rate ATR of the sample SP01 for the case where the angle between the direction of the magnetic field applied in the formation of the magnetic film and the vibration direction of the electric field of the electromagnetic wave is 90° (SP02(90°)). On the other hand, the attenuation rate ATR is higher than the attenuation rate ATR of the sample SP01 for the case where the angle between the direction of the magnetic field applied in the formation of the magnetic film and the vibration direction of the electric field of the electromagnetic wave is 0° (SP02 (0°)).

Figure 5:
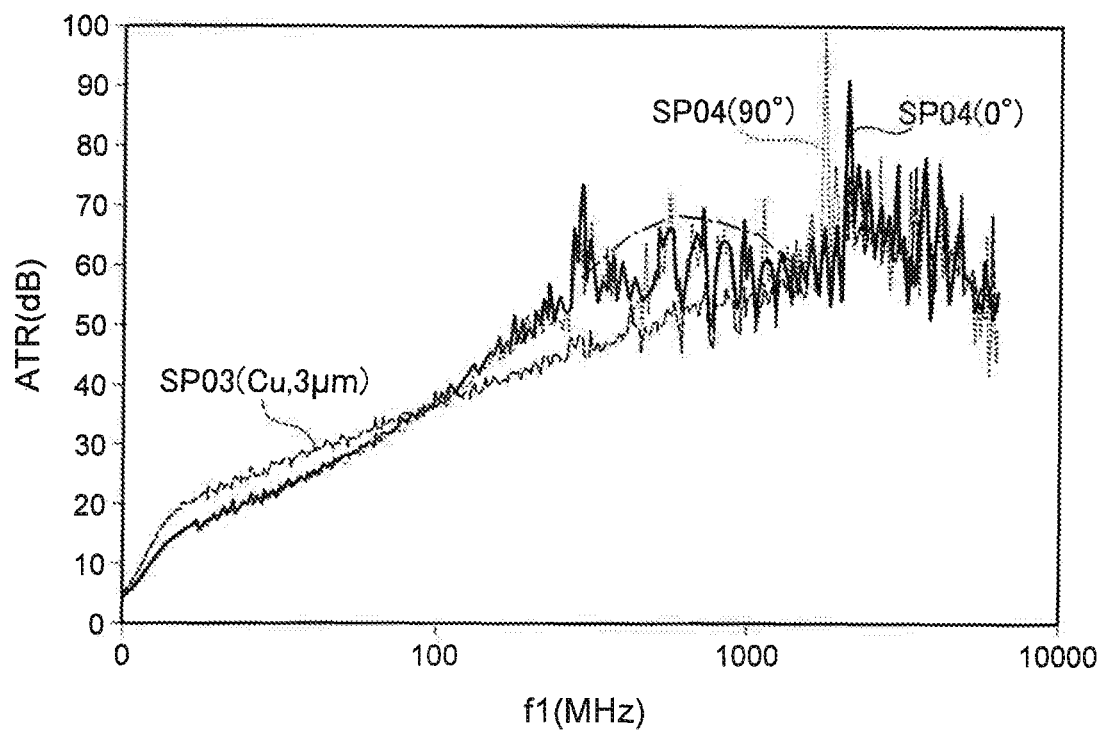
FIG. 5 is a graph illustrating characteristics of the shield films.

FIG. 5 is a graph illustrating characteristics of the shield films.

FIG. 5 shows measurement results relating to a sample SP03 and a sample SP04. Similarly to the first sample SP01, a Cu film having a thickness of 3 μm is used as the shield film in the sample SP03. In the sample SP04, a stacked film of a Cu film (having a thickness of 530 nm)/FeSi film (having a thickness of 200 nm)/Cu film (having a thickness of 530 nm)/FeSi film (having a thickness of 200 nm)/Cu film (having a thickness of 530 nm) is provided as the shield film. The two FeSi films are formed at a low pressure. The coercivity Hc is greater than 10 Oe for the FeSi films.

The attenuation characteristics of the electromagnetic waves are evaluated for such samples. For the sample SP04, the case where the angle between the direction of the magnetic field applied in the formation of the magnetic film and the vibration direction of the electric field of the electromagnetic wave is 0° (SP04(0°)) and the case of 90° (SP04(90°)) are shown.

As shown in FIG. 5, the attenuation rate ATR of the sample SP04 is substantially the same as the attenuation rate ATR of the sample SP01 regardless of the angle between the direction of the magnetic field applied in the formation of the magnetic film and the vibration direction of the electric field of the electromagnetic wave.

From the results of FIG. 4 and FIG. 5, it can be seen that a high attenuation rate ATR is obtained when the coercivity Hc is small. High shield performance is obtained when the coercivity Hc is small. As described above, the thermal stability is insufficient for the configuration of the second reference example recited above even though the coercivity Hc is small and high shield performance is obtained.

A relative permeability μr of the magnetic film will now be focused upon on.

Figure 6:
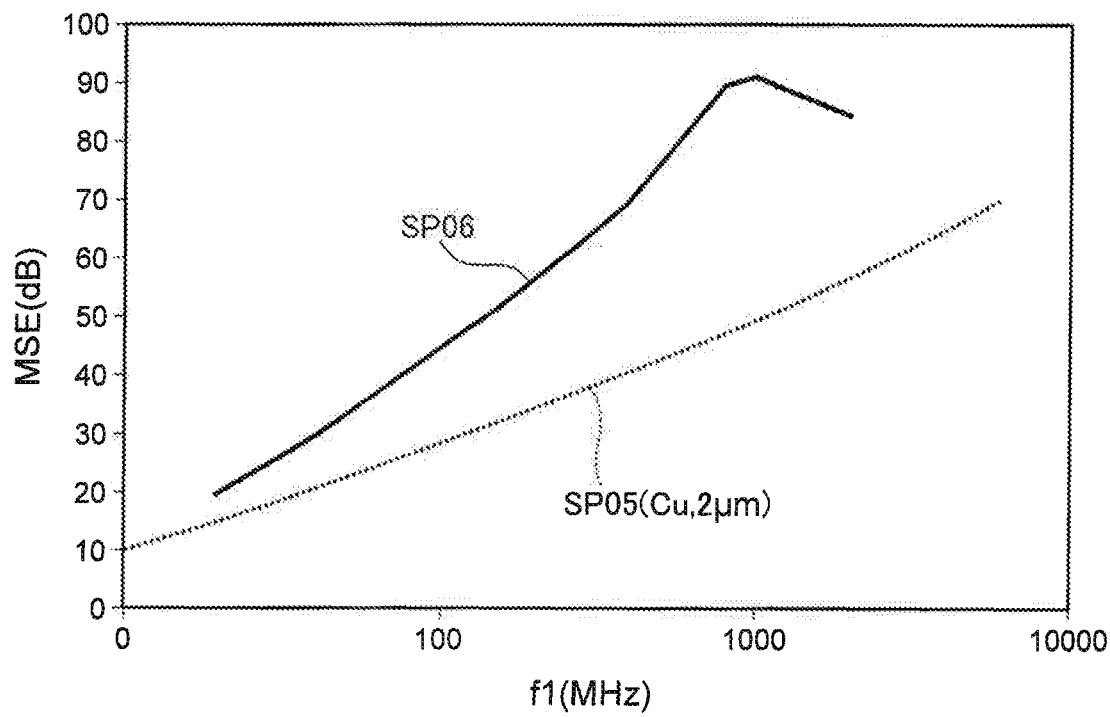
FIG. 6 is a graph illustrating characteristics of the shield films.

FIG. 6 is a graph illustrating characteristics of the shield films.

The simulation results of the characteristics of a sample SP05 and a sample SP06 are shown in FIG. 6. In the sample SP05, the shield film is a Cu film having a thickness of 2 μm. In the sample SP06, the shield film is a stacked film of a Cu film (having a thickness of 800 nm)/CoZrNb film (having a thickness of 400 nm)/Cu film (having a thickness of 800 nm). The relative permeability μr of the CoZrNb film is 993.

The horizontal axis of FIG. 6 is the frequency f1 (MHz) of the electromagnetic wave. The vertical axis is an attenuation performance MSE (dB). The attenuation performance MSE is 20 times the logarithm of the ratio of the amplitude of the magnetic field of the transmitted electromagnetic wave to the amplitude of the magnetic field of the incident electromagnetic wave. The shield performance is high when the attenuation performance MSE is high. As shown in FIG. 6, a high attenuation performance MSE is obtained for the sample SP06.

Figure 7:
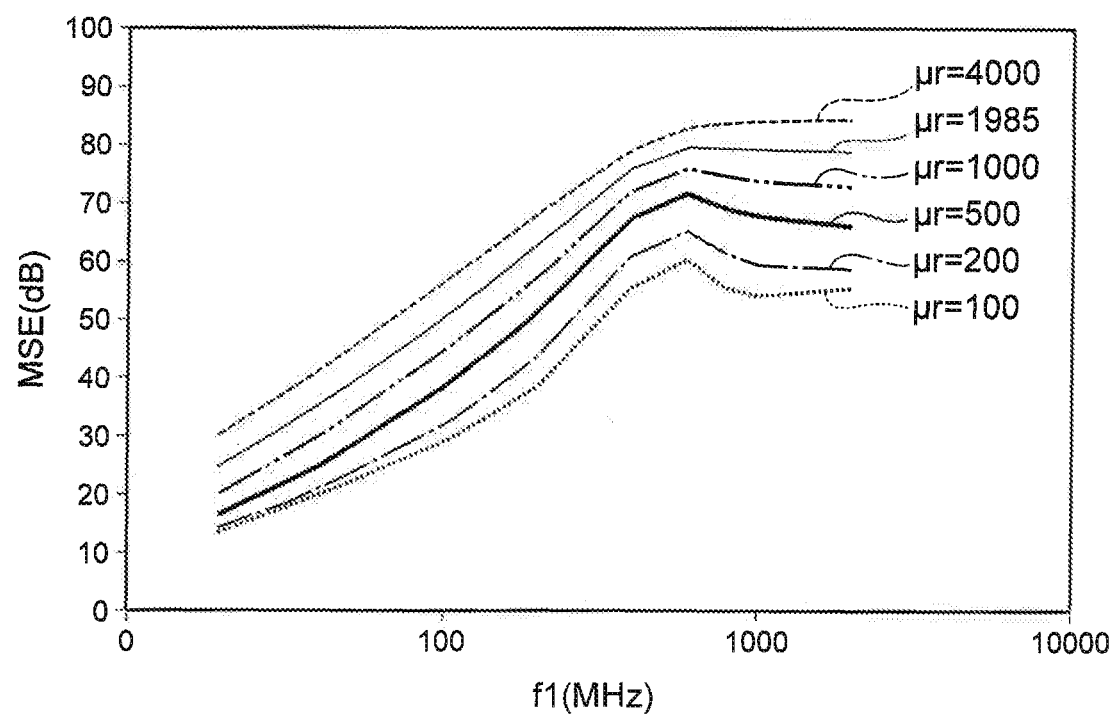
FIG. 7 is a graph illustrating characteristics of the shield films.

FIG. 7 is a graph illustrating characteristics of the shield films.

Simulation results are shown in FIG. 7. In the simulation, the shield film is a stacked film of a Cu film (having a thickness of 800 nm)/magnetic film (having a thickness of 400 nm)/Cu film (having a thickness of 800 nm). In the simulation, the relative permeability μr of the magnetic film is modified in a range of about 100 to 4000. The simulation results for the following six types of conditions will now be described. In the description recited below, $4\pi Ms$ is the saturation magnetization; and Hk is the magnetic anisotropy.

First condition: $4\pi Ms$ is 0.18 T; Hk is 17.7 Oe; and the relative permeability μr is 102.

Second condition: $4\pi Ms$ is 0.25 T; Hk is 12.8 Oe; and the relative permeability μr is 195.

Third condition: $4\pi Ms$ is 0.4 T; Hk is 8 Oe; and the relative permeability μr is 500.

Fourth condition: $4\pi Ms$ is 0.57 T; Hk is 5.6 Oe; and the relative permeability μr is 1009.

Fifth condition: $4\pi Ms$ is 0.8 T; Hk is 4 Oe; and the relative permeability μr is 1985.

Sixth condition: $4\pi Ms$ is 1.14 T; Hk is 2.8 Oe; and the relative permeability μr is 4029.

The relationship $\mu r = 4\pi Ms/Hk$ holds for the six types of conditions recited above. The ferromagnetic resonance frequency is about 500 MHz for the six types of conditions recited above.

The horizontal axis of FIG. 7 is the frequency f1 (MHz) of the electromagnetic wave. The vertical axis is the attenuation performance MSE (dB). It can be seen from FIG. 7 that a high attenuation performance MSE is obtained when the relative permeability μr is high.

Practically, for example, it is favorable to obtain a high attenuation performance MSE when the frequency f1 is about 100 MHz. For a frequency f1 of about 100 MHz, a practical and high attenuation performance MSE is obtained when the relative permeability μr is 200 or more.

From the results of FIG. 4 to FIG. 7, it is favorable for the coercivity Hc to be small (e.g., 5 Oe or less) for the magnetic film included in the shield film. It is favorable for the relative permeability μr to be high (e.g., 200 or more) for the magnetic film included in the shield film.

An example of the measurement results of the characteristics of various magnetic films will now be described.

Figures 8, 9:
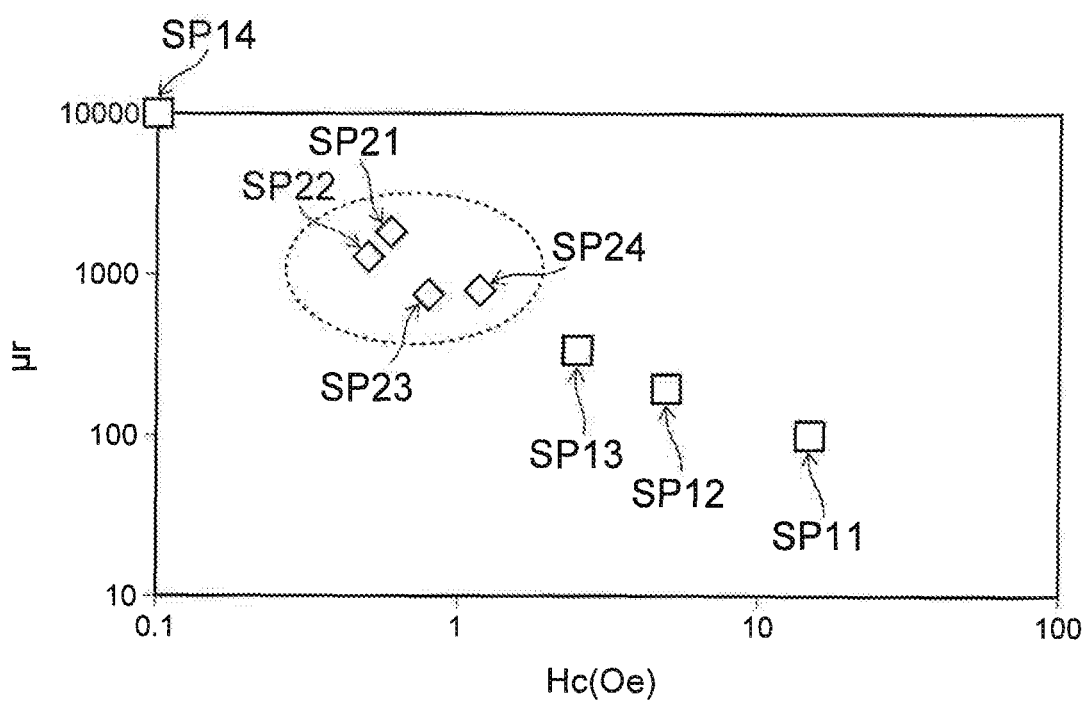
FIG. 8 is a table illustrating characteristics of the magnetic films.
FIG. 9 is a graph illustrating characteristics of the magnetic films.

FIG. 8 is a table illustrating characteristics of the magnetic films.

In FIG. 8, the measurement results of the coercivity Hc and the relative permeability μr are shown for samples SP11 to SP14 and samples SP21 to SP24. For the samples SP11 to SP13, the magnetic film is FeSi. For the sample SP11, a substrate temperature Ts of the film formation is room temperature (about 25° C.). For the sample SP12, the substrate temperature Ts is 200° C. For the sample SP13, the substrate temperature Ts is 350° C. For the sample SP14, the magnetic film is FeAlSi. For the sample SP14, heat treatment (annealing) is performed after the formation of the magnetic film; and an annealing temperature Ta is 600° C. For the samples SP21 to SP24, the shield films respectively are $Fe_{93}Zr_4N_3$, $Fe_{96.5}Zr_2N_{1.5}$, $Fe_{97.5}Zr_2N_{0.5}$, and $Fe_{90}Zr_8N_2$. For the samples SP21 to SP24, the temperature of the heat treatment is 260° C. or less.

As shown in FIG. 8, the coercivity Hc is large for the samples SP11 and SP12. For the samples SP13 and SP14, the coercivity Hc is relatively small; and the relative permeability μr is high. However, the samples SP13 and SP14 are not practical because a high substrate temperature Ts or a high annealing temperature Ta is necessary.

Conversely, for the samples SP21 to SP24, small coercivities Hc and high relative permeabilities μr are obtained. The samples SP21 to SP24 are examples of the magnetic film included in the shield according to the embodiment.

FIG. 9 is a graph illustrating characteristics of the magnetic films.

In FIG. 9, the relationship between the coercivity Hc and the relative permeability μr is shown for the samples SP11 to SP14 and the samples SP21 to SP24 recited above. The horizontal axis of FIG. 9 is the coercivity Hc (Oe). The vertical axis is the relative permeability μr. As shown in FIG. 9, the relative permeability μr is high when the coercivity Hc is small.

As described above, for the samples SP13 and SP14, the coercivity Hc is relatively small and the relative permeability μr is high; but heat treatment at a high temperature is necessary. For example, the semiconductor chip 53 or the insulating portion 54 is damaged by the heat treatment at the high temperature. Therefore, the configurations of the samples SP13 and SP14 are not practical.

Conversely, for the samples SP21 to SP24, the heat treatment at the high temperature is unnecessary; and a small coercivity Hc and a high relative permeability μr are obtained.

Figures 10, 11:
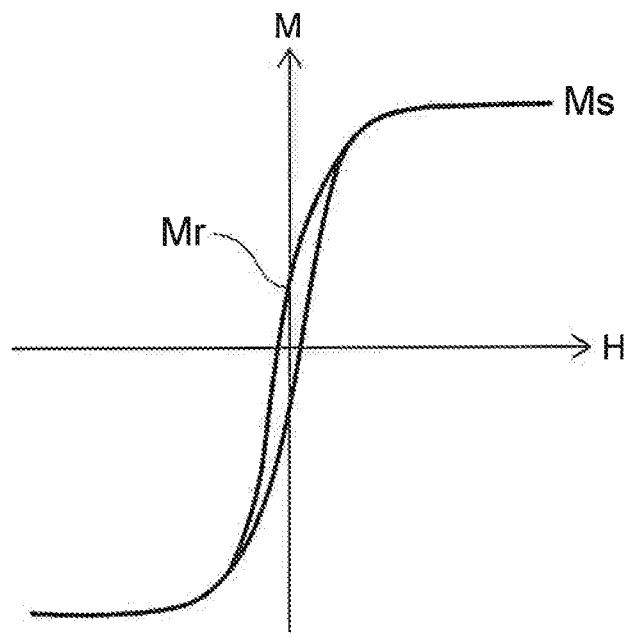
FIG. 10 is a graph illustrating a characteristic of the magnetic film.
FIG. 11 is a table illustrating characteristics of the magnetic films.

FIG. 10 is a graph illustrating a characteristic of the magnetic film.

FIG. 10 illustrates a magnetic property of the sample SP21. The horizontal axis of FIG. 10 is a magnetic field H that is applied. The vertical axis is a magnetization M. As shown in FIG. 10, a substantially isotropic magnetization-magnetic field curve is obtained for the sample SP21.

In the embodiment, it is favorable for the ratio (Mr/Ms) of a residual magnetization Mr to a saturation magnetization Ms of the magnetic film to be 0.7 or less. For example, it is favorable for the ratio (Mr/Ms) of the residual magnetization Mr of the first magnetic planar region 11$p$ to the saturation magnetization Ms of the first magnetic planar region 11$p$ to be 0.7 or less. Thereby, a large shielding effect can be obtained for an electromagnetic field in any direction.

An example of the characteristics of magnetic films of $Fe_{100-x1-x2}Zr_{x1}N_{x2}$ will now be described.

FIG. 11 is a table illustrating characteristics of the magnetic films.

In FIG. 11, the shield film is $Fe_{100-x1-x2}Zr_{x1}N_{x2}$ for samples SP31 to SP39. These magnetic films are examples when "α" of $Fe_{100-x1-x2}\alpha_{x1}N_{x2}$ is Zr. For the samples SP31 to SP39, x1 (the composition ratio of Zr) and x2 (the composition ratio of N) are modified. A magnetic film of $Fe_{100-x1-X2}Zr_{x1}N_{x2}$ is formed on a Cu film; and the coercivity Hc of the magnetic film is evaluated.

As shown in FIG. 11, the coercivity Hc is large for the sample SP31. For the samples SP32 to SP39, the coercivity Hc is 4.5 Oe or less. For example, it is favorable for x1 to be not less than 0.5 at % and not more than 10 at % and for x2 to be not less than 0.5 at % and not more than 8 at %. Thereby, a small coercivity Hc (e.g., 5 Oe or less) is obtained.

For example, in the case where x1 is lower than x2, for example, a difference that corresponds to the direction of the magnetic field occurs easily in, for example, the relative permeability μr. Therefore, the characteristics of the magnetic films are anisotropic. In the embodiment, it is favorable for x1 to be higher than x2. For example, it is favorable for the composition ratio of N (nitrogen) to be lower than the composition ratio of "α." Thereby, isotropic characteristics are obtained easily. For example, it is favorable for the composition ratio of N (nitrogen) to be lower than the composition ratio of "α" as much as possible in a range in which a low coercivity can be maintained.

FIG. 12 is a table illustrating characteristics of the magnetic films.

In FIG. 12, samples SP41 to SP48 are $Fe_{100-x1-x2}\alpha_{x1}N_{x2}$. For the samples SP41 and SP42, "α" is Ta. For the sample SP43, "α" is Nb. For the samples SP44 to SP46, "α" is Hf. For the samples SP47 and SP48, "α" is Ti. A magnetic film of $Fe_{100-x1-x2}\alpha_{x1}N_{x2}$ is formed on a Cu film; and the coercivity Hc of the magnetic film is evaluated.

As shown in FIG. 12, a small coercivity Hc that is 5 Oe or less is obtained for the samples SP41 to SP48. For example, it is favorable for x1 to be not less than 0.5 at % and not more than 10 at % and for x2 to be not less than 0.5 at % and not more than 8 at %. Thereby, a small coercivity Hc (e.g., 5 Oe or less) is obtained.

FIG. 13 is a table illustrating a characteristic of the magnetic films.

In FIG. 13, the magnetic film does not include N (nitrogen) in samples SP51 to SP55. The magnetic film is formed on a Cu film; and the coercivity Hc of the magnetic film is evaluated. As shown in FIG. 13, the coercivity Hc is large for the samples SP51 to SP55.

It can be seen from FIG. 11 to FIG. 13 that a small coercivity Hc is obtained by introducing N (nitrogen) to the magnetic film.

An example of simulation results of the shield characteristics when changing the thicknesses of the nonmagnetic film and the magnetic film included in the shield film will now be described.

FIG. 14 is a table illustrating configurations of the shield films.

Samples SP61 to SP67 shown in FIG. 14 have the configuration of a Cu film/magnetic film/Cu film. For example, one of the Cu films corresponds to the first nonmagnetic planar region 21$p$. The magnetic film corresponds to the first magnetic planar region 11$p$. For example, the other one of the Cu films corresponds to the second nonmagnetic planar region 22$p$. In the simulation, the thickness t21 of the Cu film (the first nonmagnetic planar region 21$p$) (referring to FIG. 2A), the thickness t11 of the magnetic film (the first magnetic planar region 11$p$) (referring to FIG. 2A), and the thickness t22 of the Cu film (the second nonmagnetic planar region 22$p$) (referring to FIG. 2A) are modified. For these samples, the thickness of the entire Cu film/magnetic film/Cu film is constant and is 1 μm. The thickness t22 is the same as the thickness t21. In the simulation, the relative permeability μr is 1000. This value corresponds to the states of FIG. 11 in which the coercivity Hc is smaller (lower) than 1 Oe.

Figure 15:
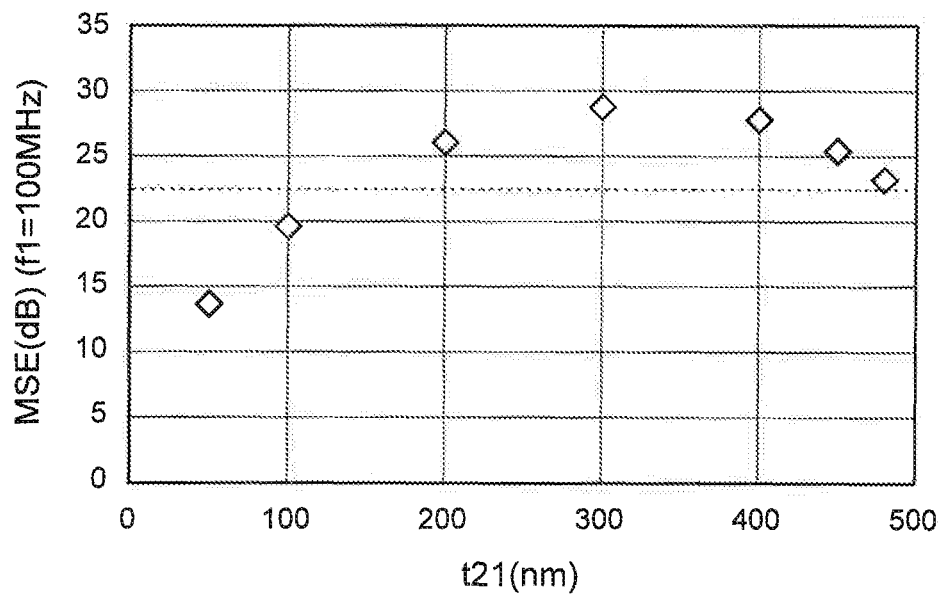
FIG. 15 is a graph illustrating characteristics of the shield film.

FIG. 15 is a graph illustrating characteristics of the shield film.

FIG. 15 shows the simulation results of the shield characteristics of the samples SP61 to SP67 recited above. FIG. 15 shows the attenuation performance MSE when the frequency f1 is 100 MHz. The horizontal axis of FIG. 15 is the thickness t21 (nm) of the Cu film. The vertical axis is the attenuation performance MSE (dB). As a reference example in FIG. 15, the value (22.5 dB) of the attenuation performance MSE when a Cu film having a thickness of 1 μm is used as the shield film is shown by the broken line.

From FIG. 15, it can be seen that an attenuation performance MSE higher than the attenuation performance MSE of the reference example is obtained when the thickness t21 of the Cu film is not less than 150 nm and not more than 480 nm.

In the embodiment, it is favorable for the thickness t21 of the first nonmagnetic planar region to be 150 nm or more. Thereby, the attenuation performance MSE that is obtained is higher than that of the reference example (the Cu film of 1 μm).

When the thickness t21 of the Cu film is 480 nm (sample SP61), the thickness t11 of the magnetic film is 40 nm. In such a case, the attenuation performance MSE is substantially the same as the attenuation performance MSE of the reference example. In the embodiment, it is favorable for the thickness t11 of the magnetic film (the first magnetic planar region 11$p$) to be thicker than 40 nm. For example, it is favorable for the thickness t11 of the first magnetic planar region 11$p$ to be 50 nm or more.

When the thickness t11 of the magnetic film (the first magnetic planar region 11$p$) is 40 nm or less, for example, it is considered that there are cases where magnetic anisotropy occurs due to the effect at the interface vicinity between the magnetic film and the nonmagnetic film.

For example, when the thickness t11 of the first magnetic planar region 11p is 50 nm or more, the effect at the interface vicinity becomes small; and the magnetic anisotropy is suppressed. Thereby, high shield performance is obtained more easily.

In the embodiment, the number of magnetic films may be two or more. For example, multiple magnetic films (regions) may be provided in the planar portion 10p.

Second Embodiment

Figure 16:
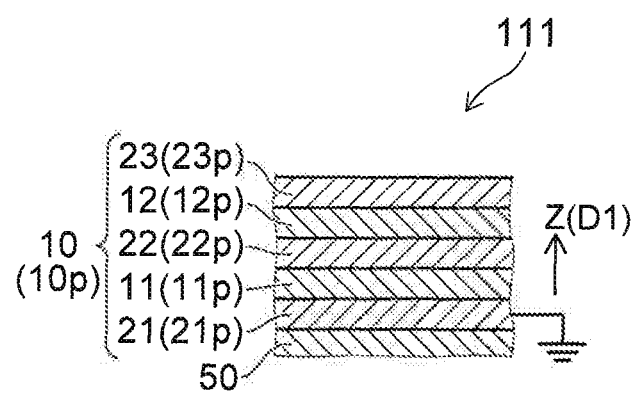
FIG. 16 is a schematic view illustrating a semiconductor device according to a second embodiment.

FIG. 16 is a schematic view illustrating a semiconductor device according to a second embodiment.

FIG. 16 is a cross-sectional view corresponding to line C1-C2 of FIG. 1B.

In the semiconductor device 111 as shown in FIG. 16, the first member 10 includes a second magnetic film 12 and a third nonmagnetic film 23 in addition to the first nonmagnetic film 21, the first magnetic film 11, and the second nonmagnetic film 22. As described above, the first nonmagnetic film 21 includes the first nonmagnetic planar region 21p. The first magnetic film 11 includes the first magnetic planar region 11p. The second nonmagnetic film 22 includes the second nonmagnetic planar region 22p. Similarly, the second magnetic film 12 includes a second magnetic planar region 12p. The third nonmagnetic film 23 includes a third nonmagnetic planar region 23p.

The first nonmagnetic planar region 21p, the first magnetic planar region 11p, the second nonmagnetic planar region 22p, the second magnetic planar region 12p, and the third nonmagnetic planar region 23p are provided in the planar portion 10p of the first member 10.

The second nonmagnetic planar region 22p is positioned between the second magnetic planar region 12p and the first magnetic planar region 11p in the first direction D1. The second magnetic planar region 12p is positioned between the second nonmagnetic planar region 22p and the third nonmagnetic planar region 23p in the first direction D1.

At least a portion of the second magnetic planar region 12p includes $Fe_{100-x3-x4}\alpha_{x3}N_{x4}$. "$\alpha$" includes at least one selected from the group consisting of Zr, Hf, Ta, Nb, Ti, Si, and Al. x3 is not less than 0.5 atomic percent and not more than 10 atomic percent. x4 is not less than 0.5 atomic percent and not more than 8 atomic percent.

The material of the second magnetic planar region 12p may be the same as or different from the material of the first magnetic planar region 11p. The thickness of the second magnetic planar region 12p may be the same as or different from the thickness t11 of the first magnetic planar region 11p (referring to FIG. 2A).

The material of the third nonmagnetic planar region 23p may be the same as or different from the material of the first nonmagnetic planar region 21p. The material of the third nonmagnetic planar region 23p may be the same as or different from the material of the second nonmagnetic planar region 22p. The thickness of the third nonmagnetic planar region 23p may be the same as or different from the thickness (t21) of the first nonmagnetic planar region 21p. The thickness of the third nonmagnetic planar region 23p may be the same as or different from the thickness (t22) of the second nonmagnetic planar region 22p.

In the embodiment, a magnetic film is provided between multiple nonmagnetic films. Multiple nonmagnetic films and multiple magnetic films may be arranged alternately. The number of multiple magnetic films is arbitrary. In the case where the number of multiple magnetic films is large, the number of interfaces between the magnetic films and the nonmagnetic films increases. Thereby, a higher shield performance is obtained.

Figure 17:
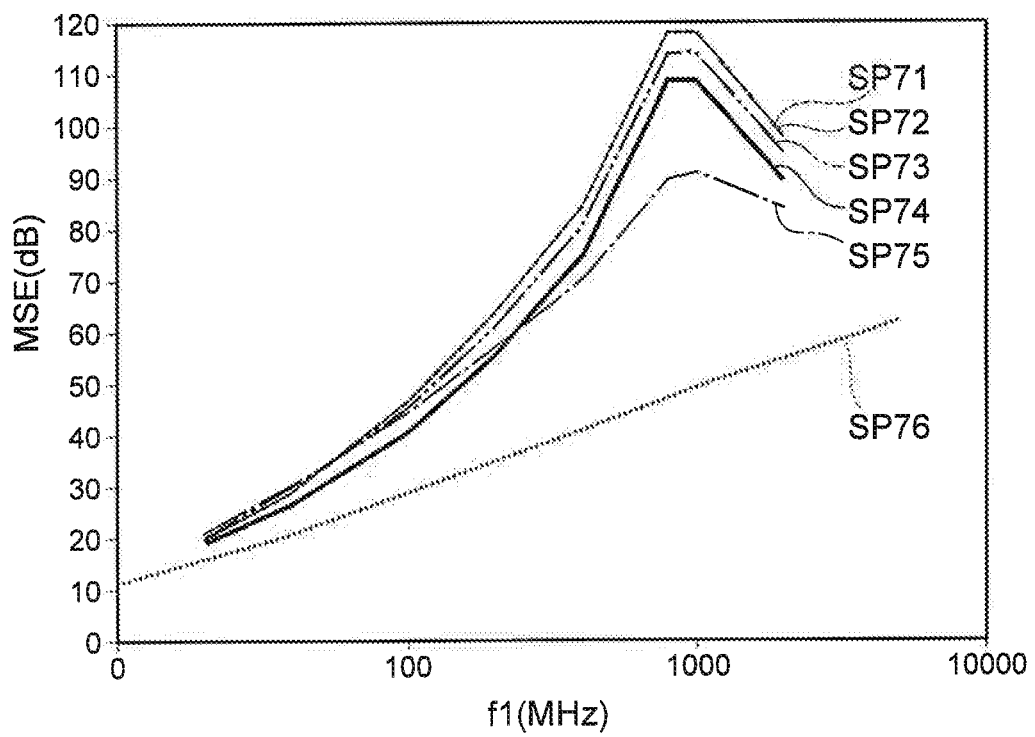
FIG. 17 is a graph illustrating characteristics of the shield films.

FIG. 17 is a graph illustrating characteristics of the shield films.

FIG. 17 shows the simulation results of the shield characteristics of samples SP71 to SP76. Two magnetic films are provided in the samples SP71 to SP74.

For the sample SP71, the shield film is a Cu film (having a thickness of 500 nm)/magnetic film (having a thickness of 200 nm)/Cu film (having a thickness of 600 nm)/magnetic film (having a thickness of 200 nm)/Cu film (having a thickness of 500 nm).

For the sample SP72, the shield film is a Cu film (having a thickness of 600 nm)/magnetic film (having a thickness of 200 nm)/Cu film (having a thickness of 400 nm)/magnetic film (having a thickness of 200 nm)/Cu film (having a thickness of 600 nm).

For the sample SP73, the shield film is a Cu film (having a thickness of 200 nm)/magnetic film (having a thickness of 200 nm)/Cu film (having a thickness of 1200 nm)/magnetic film (having a thickness of 200 nm)/Cu film (having a thickness of 200 nm).

For the sample SP74, the shield film is a Cu film (having a thickness of 700 nm)/magnetic film (having a thickness of 200 nm)/Cu film (having a thickness of 200 nm)/magnetic film (having a thickness of 200 nm)/Cu film (having a thickness of 700 nm).

One magnetic film is provided in the sample SP75. In the sample SP75, the shield film is a Cu film (having a thickness of 900 nm)/magnetic film (having a thickness of 400 nm)/Cu film (having a thickness of 900 nm). In the sample SP76, the shield film is a Cu film having a thickness of 2 μm.

In the simulations of the samples SP71 to SP75 recited above, the relative permeability μr is 1000. This value corresponds to the states illustrated in FIG. 11 in which the coercivity Hc is smaller (lower) than 1 Oe.

The horizontal axis of FIG. 17 is the frequency f1 (MHz). The vertical axis is the attenuation performance MSE (dB).

It can be seen from FIG. 17 that a high attenuation performance MSE is obtained for the samples SP71 to SP74 that include two magnetic films. For the samples SP71 to SP74, a high attenuation performance MSE is obtained particularly at the vicinity of the frequency f1 of 1 GHz.

Examples of side surface portions of the first member 10 will now be described.

FIG. 18A to FIG. 18D are schematic cross-sectional views illustrating a portion of the semiconductor device.

Figure 18A:
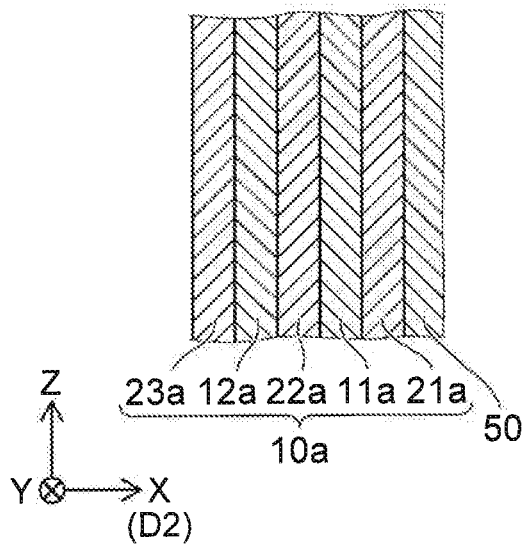
FIG. 18A to FIG. 18D are schematic cross-sectional views illustrating a portion of the semiconductor device.

As shown in FIG. 18A, the first member 10 (the first side surface portion 10a) includes a first magnetic side surface region 11a and a first nonmagnetic side surface region 21a. In the example, the first side surface portion 10a further includes a nonmagnetic side surface region 22a, a magnetic side surface region 12a, and a nonmagnetic side surface region 23a.

The first magnetic side surface region 11a is separated from the semiconductor element 50 in the second direction D2. The second direction D2 crosses the first direction D1. In the example, the second direction D2 is the X-axis direction. The first nonmagnetic side surface region 21a is provided between the first magnetic side surface region 11a and the semiconductor element 50 in the second direction D2. For example, the material of the first magnetic side surface region 11a is the same as the material of the first magnetic planar region 11p. For example, the first magnetic side surface region 11a is continuous with the first magnetic planar region 11p. For example, the material of the first nonmagnetic side surface region 21a is the same as the material of the first nonmagnetic planar region 21p. For example, the first nonmagnetic side surface region 21a is continuous with the first nonmagnetic planar region 21p.

The magnetic side surface region 12a is positioned between the nonmagnetic side surface region 23a and the semiconductor element 50 in the second direction D2. The nonmagnetic side surface region 22a is positioned between the magnetic side surface region 12a and the semiconductor element 50 in the second direction D2. The first magnetic side surface region 11a is positioned between the nonmagnetic side surface region 22a and the semiconductor element 50 in the second direction D2. The first nonmagnetic side surface region 21a is positioned between the first magnetic side surface region 11a and the semiconductor element 50 in the second direction D2.

Figure 18B:
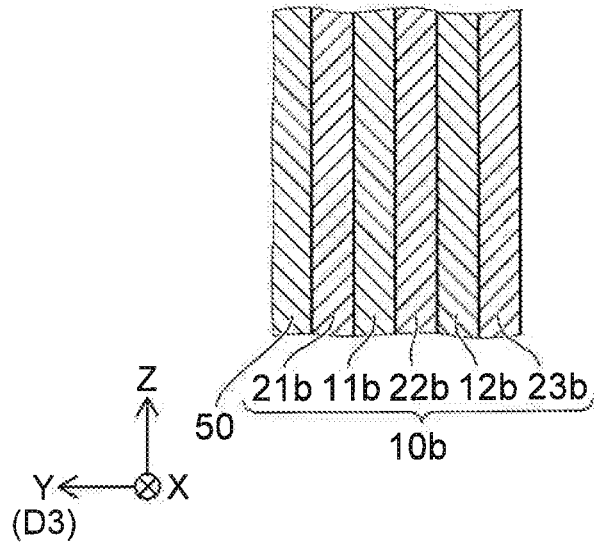

As shown in FIG. 18B, the first member 10 (the second side surface portion 10b) includes a second magnetic side surface region 11b and a second nonmagnetic side surface region 21b. In the example, the second side surface portion 10b further includes a nonmagnetic side surface region 22b, a magnetic side surface region 12b, and a nonmagnetic side surface region 23b.

The second magnetic side surface region 11b is separated from the semiconductor element 50 in the third direction D3. The third direction D3 crosses a plane including the first direction D1 and the second direction D2. In the example, the third direction D3 is the Y-axis direction.

The second nonmagnetic side surface region 21b is provided between the second magnetic side surface region 11b and the semiconductor element 50 in the third direction D1 For example, the material of the second magnetic side surface region 11b is the same as the material of the first magnetic planar region 11p. For example, the second magnetic side surface region 11b is continuous with the first magnetic planar region 11p. For example, the material of the second nonmagnetic side surface region 21b is the same as the material of the first nonmagnetic planar region 21p. For example, the second nonmagnetic side surface region 21b is continuous with the first nonmagnetic planar region 21p.

The magnetic side surface region 12b is positioned between the nonmagnetic side surface region 23b and the semiconductor element 50 in the third direction D3. The nonmagnetic side surface region 22b is positioned between the magnetic side surface region 12b and the semiconductor element 50 in the third direction D3. The second magnetic side surface region 11b is positioned between the nonmagnetic side surface region 22b and the semiconductor element 50 in the third direction D3. The second nonmagnetic side surface region 21b is positioned between the second magnetic side surface region 11b and the semiconductor element 50 in the third direction D3.

Figure 18C:
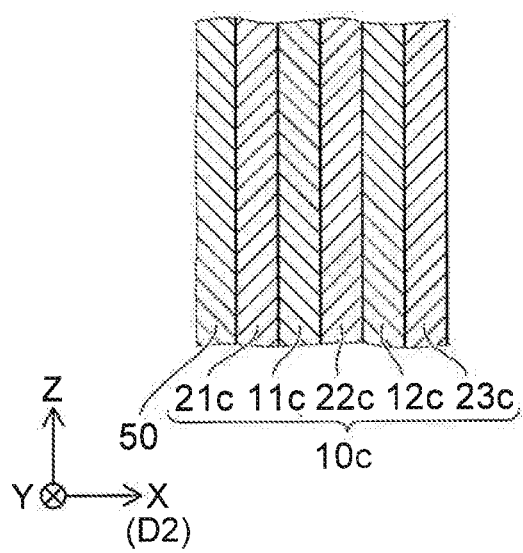

As shown in FIG. 18C, the first member 10 (the third side surface portion 10c) includes a third magnetic side surface region 11c and a third nonmagnetic side surface region 21c. In the example, the third side surface portion 10c further includes a nonmagnetic side surface region 22c, a magnetic side surface region 12c, and a nonmagnetic side surface region 23c.

The third magnetic side surface region 11c is separated from the semiconductor element 50 in the second direction D2 (e.g., the X-axis direction). The third nonmagnetic side surface region 21c is provided between the third magnetic side surface region 11c and the semiconductor element 50 in the second direction D2. For example, the material of the third magnetic side surface region 11c is the same as the material of the first magnetic planar region 11p. For example, the third magnetic side surface region 11c is continuous with the first magnetic planar region 11p. For example, the material of the third nonmagnetic side surface region 21c is the same as the material of the first nonmagnetic planar region 21p. For example, the third nonmagnetic side surface region 21c is continuous with the first nonmagnetic planar region 21p.

The magnetic side surface region 12c is positioned between the nonmagnetic side surface region 23c and the semiconductor element 50 in the second direction D2. The nonmagnetic side surface region 22c is positioned between the magnetic side surface region 12c and the semiconductor element 50 in the second direction D2. The third magnetic side surface region 11c is positioned between the nonmagnetic side surface region 22c and the semiconductor element 50 in the second direction D2. The third nonmagnetic side surface region 21c is positioned between the third magnetic side surface region 11c and the semiconductor element 50 in the second direction D2.

Figure 18D:
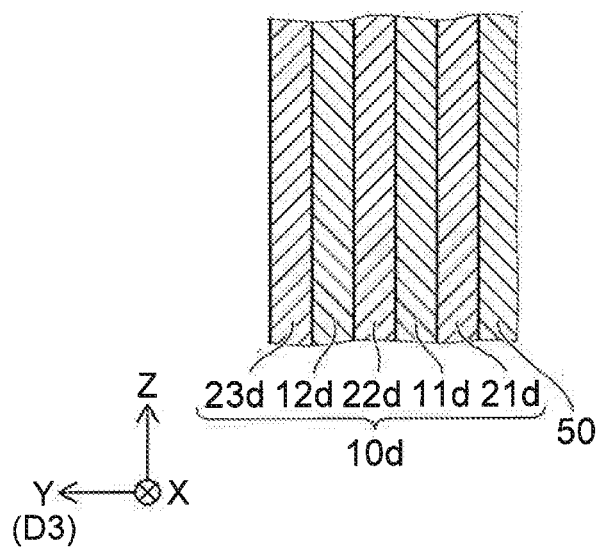

As shown in FIG. 18D, the first member 10 (the fourth side surface portion 10d) includes a fourth magnetic side surface region 11d and a fourth nonmagnetic side surface region 21d. In the example, the fourth side surface portion 10d further includes a nonmagnetic side surface region 22d, a magnetic side surface region 12d, and a nonmagnetic side surface region 23d.

The fourth magnetic side surface region 11d is separated from the semiconductor element 50 in the third direction D3. The fourth nonmagnetic side surface region 21d is provided between the fourth magnetic side surface region 11d and the semiconductor element 50 in the third direction D3. For example, the material of the fourth magnetic side surface region 11d is the same as the material of the first magnetic planar region 11p. For example, the fourth magnetic side surface region 11d is continuous with the first magnetic planar region 11p. For example, the material of the fourth nonmagnetic side surface region 21d is the same as the material of the first nonmagnetic planar region 21p. For example, the fourth nonmagnetic side surface region 21d is continuous with the first nonmagnetic planar region 21p.

The magnetic side surface region 12d is positioned between the nonmagnetic side surface region 23d and the semiconductor element 50 in the third direction D3. The nonmagnetic side surface region 22d is positioned between the magnetic side surface region 12d and the semiconductor element 50 in the third direction D3. The fourth magnetic side surface region 11d is positioned between the nonmagnetic side surface region 22d and the semiconductor element 50 in the third direction D3. The fourth nonmagnetic side surface region 21d is positioned between the fourth magnetic side surface region 11d and the semiconductor element 50 in the third direction D3.

Thus, the magnetic films (regions) and the nonmagnetic films (regions) are provided in each of the first to fourth side surface portions 10a to 10d. The transmittance of the electromagnetic wave traveling along directions in the X-Y plane can be reduced. The attenuation characteristics of the electromagnetic waves can be improved further.

Figure 19:
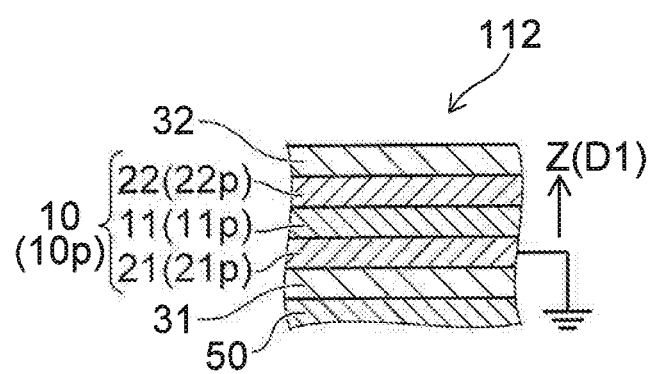
FIG. 19 is a schematic view illustrating the semiconductor device according to the embodiment.

FIG. 19 is a schematic view illustrating the semiconductor device according to the embodiment.

As shown in FIG. 19, a first conductive layer 31 and a second conductive layer 32 are provided in the semiconductor device 112.

The first conductive layer 31 is provided between the first member 10 and the semiconductor element 50. In the example, the first conductive layer 31 is provided between the first nonmagnetic planar region 21p and the semiconductor element 50.

The first member 10 is positioned between the second conductive layer 32 and the semiconductor element 50.

The corrosion resistance of at least one of the first conductive layer 31 or the second conductive layer 32 is higher than the corrosion resistance of the first member 10. At least one of the first conductive layer 31 or the second conductive layer 32 includes, for example, Fe and Cr. The composition ratio of Fe is 50% or more for these conductive layers. At least one of the first conductive layer 31 or the second conductive layer 32 includes, for example, "stainless steel."

The first conductive layer 31 is, for example, a foundation layer. The second conductive layer 32 is, for example, a capping layer. The corrosion of the nonmagnetic film (e.g., Cu, etc.) included in the first member 10 is suppressed by these conductive layers. In the semiconductor device 112 as well, the attenuation characteristics of the electromagnetic waves can be improved.

Several examples of a method for manufacturing the first member 10 will now be described.

For example, the first nonmagnetic film 21 and the second nonmagnetic film 22 (e.g., the first nonmagnetic planar region 21p and the second nonmagnetic planar region 22p) and the like can be formed by sputtering.

For example, in the film formation of the first nonmagnetic planar region 21p, there are cases where, for example, an unevenness occurs in the surface of the first nonmagnetic planar region 21p reflecting an unevenness of the insulating portion 54. There are cases where the unevenness is a factor that increases the coercivity Hc of the first magnetic planar region 11p. For example, plasma processing using Ar gas may be performed between the film formation of the first nonmagnetic planar region 21p and the film formation of the first magnetic planar region 11p. Thereby, the unevenness is suppressed.

The first magnetic planar region 11p includes $Fe_{100-x1-x2}\alpha_{x1}N_{x2}$. The first magnetic planar region 11p can be formed by, for example, sputtering using a target including Fe and "α" in a gas atmosphere in which nitrogen is added to Ar. For example, the concentration of nitrogen in the gas atmosphere is, for example, 10% or less.

The embodiments may include the following configurations (e.g., technological proposals).

Configuration 1

A semiconductor device, comprising:
a semiconductor element; and
a first member,
the first member including
a first magnetic planar region separated from the semiconductor element in a first direction, and
a first nonmagnetic planar region provided between the first magnetic planar region and the semiconductor element in the first direction,
at least a portion of the first magnetic planar region including $Fe_{100-x1-x2}\alpha_{x1}N_{x2}$, α including at least one selected from the group consisting of Zr, Hf, Ta, Nb, Ti, Si, and Al, x1 being not less than 0.5 atomic percent and not more than 10 atomic percent, x2 being not less than 0.5 atomic percent and not more than 8 atomic percent.

Configuration 2

The semiconductor device according to Configuration 1, wherein
the first member further includes a second nonmagnetic planar region, and
the first magnetic planar region is positioned between the first nonmagnetic planar region and the second nonmagnetic planar region in the first direction.

Configuration 3

The semiconductor device according to Configuration 2, wherein the second nonmagnetic planar region includes at least one selected from the group consisting of Cu, Al, and Ag.

Configuration 4

The semiconductor device according to any one of Configurations 1 to 3, wherein the first nonmagnetic planar region includes at least one selected from the group consisting of Cu, Al, and Ag.

Configuration 5

The semiconductor device according to any one of Configurations 1 to 3, wherein the first nonmagnetic planar region includes Cu.

Configuration 6

The semiconductor device according to any one of Configurations 1 to 5, wherein a ratio of a residual magnetization of the first magnetic planar region to a saturation magnetization of the first magnetic planar region is 0.7 or less.

Configuration 7

The semiconductor device according to any one of Configurations 1 to 6, wherein x1 is higher than x2.

Configuration 8

The semiconductor device according to any one of Configurations 1 to 7, wherein a thickness along the first direction of the first nonmagnetic planar region is 150 nm or more.

Configuration 9

The semiconductor device according to any one of Configurations 1 to 8, wherein a thickness along the first direction of the first magnetic planar region is 50 nm or more.

Configuration 10

The semiconductor device according to any one of Configurations 1 to 9, wherein
the first magnetic planar region includes multiple magnetic domains, and
a direction of a magnetization of one of the multiple magnetic domains crosses a direction of a magnetization of another one of the multiple magnetic domains.

Configuration 11

The semiconductor device according to Configuration 10, wherein a direction of a magnetization of yet another one of the multiple magnetic domains crosses the direction of the magnetization of the one of the multiple magnetic domains and crosses the direction of the magnetization of the other one of the multiple magnetic domains.

Configuration 12

The semiconductor device according to Configuration 10 or 11, wherein a length of the one of the multiple magnetic domains along a direction crossing the first direction is not less than 0.1 µm and not more than 200 µm.

Configuration 13

The semiconductor device according to any one of Configurations 10 to 12, wherein the multiple magnetic domains are arranged in a plane crossing the first direction.

Configuration 14

The semiconductor device according to any one of Configurations 1 to 13, wherein
the first member further includes a second magnetic planar region,
the second nonmagnetic planar region is positioned between the second magnetic planar region and the first magnetic planar region in the first direction, and at least a portion of the second magnetic planar region includes $Fe_{100-x3-x4}\alpha_{x3}N_{x4}$, $\alpha$ including at least one selected from the group consisting of Zr, Hf, Ta, Nb, Ti, Si, and Al, x3 being not less than 0.5 atomic percent and not more than 10 atomic percent, x4 being not less than 0.5 atomic percent and not more than 8 atomic percent.

Configuration 15

The semiconductor device according to any one of Configurations 1 to 14, wherein
the semiconductor element includes:
a semiconductor chip; and
an insulating portion including a resin and being provided between the first member and at least a portion of the semiconductor chip.

Configuration 16

The semiconductor device according to any one of Configurations 1 to 15, wherein
the first member further includes:
a first magnetic side surface region separated from the semiconductor element in a second direction crossing the first direction; and
a first nonmagnetic side surface region provided between the first magnetic side surface region and the semiconductor element in the second direction, and
a material of the first magnetic side surface region is the same as a material of the first magnetic planar region.

Configuration 17

The semiconductor device according to Configuration 16, wherein
the first member further includes:
a second magnetic side surface region separated from the semiconductor element in a third direction, the third direction crossing a plane including the first direction and the second direction; and
a second nonmagnetic side surface region provided between the second magnetic side surface region and the semiconductor element in the third direction, and
a material of the second magnetic side surface region is the same as the material of the first magnetic planar region.

Configuration 18

The semiconductor device according to Configuration 16 or 17, wherein
the first member further includes:
a third magnetic side surface region; and
a third nonmagnetic side surface region,
the semiconductor element is positioned between the first magnetic side surface region and the third magnetic side surface region in the second direction,
the third nonmagnetic side surface region is positioned between the, third magnetic side surface region and the semiconductor element in the second direction, and
a material of the third magnetic side surface region is the same as the material of the first magnetic planar region.

Configuration 19

The semiconductor device according to any one of Configurations 16 to 18, wherein
the first member further includes:
a fourth magnetic side surface region; and
a fourth nonmagnetic side surface region,
the semiconductor element is positioned between the second magnetic side surface region and the fourth magnetic side surface region in the third direction,
the fourth nonmagnetic side surface region is positioned between the fourth magnetic side surface region and the semiconductor element in the third direction, and
a material of the fourth magnetic side surface region is the same as the material of the first magnetic planar region.

According to the embodiments, a semiconductor device can be provided in which the attenuation characteristics of the electromagnetic waves can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor elements, semiconductor chips, first members, magnetic regions, nonmagnetic regions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor element; and
a first member,
the first member including
a first magnetic planar region separated from the semiconductor element in a first direction, and
a first nonmagnetic planar region provided between the first magnetic planar region and the semiconductor element in the first direction,
at least a portion of the first magnetic planar region including $Fe_{100-x-1-x2\alpha x1}N_{x2}$, $\alpha$ including at least one selected from the group consisting of Zr, Hf, Ta, Nb, Ti, Si, and Al, x1 being not less than 0.5 atomic percent and not more than 10 atomic percent, x2 being not less than 0.5 atomic percent and not more than 8 atomic percent,
wherein:
the first magnetic planar region includes a plurality of magnetic domains, and
a direction of a magnetization of one of the plurality of magnetic domains crosses a direction of a magnetization of another one of the plurality of magnetic domains.

2. The device according to claim 1, wherein
the first member further includes a second nonmagnetic planar region, and the first magnetic planar region is positioned between the first nonmagnetic planar region and the second nonmagnetic planar region in the first direction.

3. The device according to claim 2, wherein the second nonmagnetic planar region includes at least one selected from the group consisting of Cu, Al, and Ag.

4. The device according to claim 1, wherein the first nonmagnetic planar region includes at least one selected from the group consisting of Cu, Al, and Ag.

5. The device according to claim 1, wherein the first nonmagnetic planar region includes Cu.

6. The device according to claim 1, wherein a ratio of a residual magnetization of the first magnetic planar region to a saturation magnetization of the first magnetic planar region is 0.7 or less.

7. The device according to claim 1, wherein x1 is higher than x2.

8. The device according to claim 1, wherein a thickness along the first direction of the first nonmagnetic planar region is 150 nm or more.

9. The device according to claim 1, wherein a thickness along the first direction of the first magnetic planar region is 50 nm or more.

10. The device according to claim 1, wherein a direction of a magnetization of yet another one of the plurality of magnetic domains crosses the direction of the magnetization of the one of the plurality of magnetic domains and crosses the direction of the magnetization of the other one of the plurality of magnetic domains.

11. The device according to claim 1, wherein a length of the one of the plurality of magnetic domains along a direction crossing the first direction is not less than 0.1 μm and not more than 200 μm.

12. The device according to claim 1, wherein the plurality of magnetic domains are arranged in a plane crossing the first direction.

13. The device according to claim 2, wherein
the first member further includes a second magnetic planar region,
the second nonmagnetic planar region is positioned between the second magnetic planar region and the first magnetic planar region in the first direction, and
at least a portion of the second magnetic planar region includes $Fe_{100-x3-x4}\alpha_{x3}N_{x4}$, α including at least one selected from the group consisting of Zr, Hf, Ta, Nb, Ti, Si, and Al, x3 being not less than 0.5 atomic percent and not more than 10 atomic percent, x4 being not less than 0.5 atomic percent and not more than 8 atomic percent.

14. The device according to claim 1, wherein
the semiconductor element includes:
a semiconductor chip; and
an insulating portion including a resin and being provided between the first member and at least a portion of the semiconductor chip.

15. The device according to claim 1, wherein
the first member further includes:
a first magnetic side surface region separated from the semiconductor element in a second direction crossing the first direction; and
a first nonmagnetic side surface region provided between the first magnetic side surface region and the semiconductor element in the second direction, and
a material of the first magnetic side surface region is the same as a material of the first magnetic planar region.

16. The device according to claim 15, wherein
the first member further includes:
a second magnetic side surface region separated from the semiconductor element in a third direction, the third direction crossing a plane including the first direction and the second direction; and
a second nonmagnetic side surface region provided between the second magnetic side surface region and the semiconductor element in the third direction, and
a material of the second magnetic side surface region is the same as the material of the first magnetic planar region.

17. The device according to claim 15, wherein
the first member further includes:
a third magnetic side surface region; and
a third nonmagnetic side surface region,
the semiconductor element is positioned between the first magnetic side surface region and the third magnetic side surface region in the second direction,
the third nonmagnetic side surface region is positioned between the third magnetic side surface region and the semiconductor element in the second direction, and
a material of the third magnetic side surface region is the same as the material of the first magnetic planar region.

18. The device according to claim 15, wherein
the first member further includes:
a fourth magnetic side surface region; and
a fourth nonmagnetic side surface region,
the semiconductor element is positioned between the second magnetic side surface region and the fourth magnetic side surface region in the third direction,
the fourth nonmagnetic side surface region is positioned between the fourth magnetic side surface region and the semiconductor element in the third direction, and
a material of the fourth magnetic side surface region is the same as the material of the first magnetic planar region.

* * * * *